(12) United States Patent
Kim et al.

(10) Patent No.: US 8,055,859 B2
(45) Date of Patent: Nov. 8, 2011

(54) APPARATUS AND METHOD FOR PROVIDING ATOMICITY WITH RESPECT TO REQUEST OF WRITE OPERATION FOR SUCCESSIVE SECTOR

(75) Inventors: Jin-kyu Kim, Seoul (KR); Kyoung-il Bang, Suwoni-si (KR); Song-ho Yoon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 770 days.

(21) Appl. No.: 11/743,167

(22) Filed: May 2, 2007

(65) Prior Publication Data

US 2008/0062786 A1 Mar. 13, 2008

(30) Foreign Application Priority Data

Sep. 13, 2006 (KR) .................. 10-2006-0088723

(51) Int. Cl.
*G06F 12/00* (2006.01)
(52) U.S. Cl. ........................... 711/156; 711/103
(58) Field of Classification Search .................. 711/103, 711/156; 714/27, 54
See application file for complete search history.

(56) References Cited

U.S. PATENT DOCUMENTS

| | | | | |
|---|---|---|---|---|
| 5,566,314 A * | 10/1996 | DeMarco et al. | ............. | 711/103 |
| 6,601,132 B2 * | 7/2003 | Nomura et al. | ............... | 711/103 |
| 7,240,178 B2 * | 7/2007 | Nakada et al. | ................ | 711/203 |
| 7,254,592 B1 * | 8/2007 | Matero | ......................... | 707/203 |
| 7,613,743 B1 * | 11/2009 | Giampaolo et al. | ................. | 1/1 |
| 2004/0027886 A1 | 2/2004 | Tomita et al. | | |
| 2005/0144362 A1 * | 6/2005 | Lin et al. | ....................... | 711/103 |

FOREIGN PATENT DOCUMENTS

| KR | 1999-0076171 A | 10/1999 |
|---|---|---|
| KR | 10-2005-0009045 A | 1/2005 |

OTHER PUBLICATIONS

Abraham Silberschatz, et al., "Operating System Concepts", 1994, Addison-Wesley Publishing, Fourth Edtion, 8 pages.*

* cited by examiner

Primary Examiner — Jared Rutz
(74) Attorney, Agent, or Firm — Sughrue Mion, PLLC

(57) ABSTRACT

An apparatus for providing atomicity with respect to a request of a write operation for successive sectors in a flash memory is provided. The apparatus includes a data write module writing data in a main sector of a page and allocating status bits indicating a status of the data write to a spare sector of the page, a write progress managing module overwriting a commit mark in the spare sector allocated with the status bits according to a progress status of the data write, and a validity determining module determining validity of the sectors on the basis of the overwritten commit mark and providing information of the successive sectors.

16 Claims, 12 Drawing Sheets

| | | |
|---|---|---|
| PHYSICAL SECTOR #0 | SECTOR 1 (901a) | UNCOMMIT |
| PHYSICAL SECTOR #1 | SECTOR 2 (901b) | UNCOMMIT |
| PHYSICAL SECTOR #2 | SECTOR 3 (901c) | UNCOMMIT |
| ⋮ | SECTOR 4 (901d) | UNCOMMIT |
| | SECTOR 5 (901e) | UNCOMMIT |
| | SECTOR 6 (901f) | COMMIT |
| | | FREE |
| | | FREE |
| | | FREE |
| | | FREE |

| | |
|---|---|
| SECTOR 1 | 0 |
| SECTOR 2 | 0 |
| SECTOR 3 | 0 |
| SECTOR 4 | 0 |
| SECTOR 5 | 0 |
| SECTOR 6 | 0 |
| . . . | 1 |
| | 1 |
| | 1 |
| | 1 |

FIG. 10A

| | |
|---|---|
| SECTOR 1 (1001a) | UNCOMMIT |
| SECTOR 2 (1001b) | COMMIT |
| SECTOR 3 (1001c) | UNCOMMIT |
| SECTOR 4 (1001d) | UNCOMMIT |
| SECTOR 5 (1001e) | UNCOMMIT |
| SECTOR 6 (1001f) | UNCOMMIT |
| SECTOR 7 (1001g) | UNCOMMIT |
| SECTOR 8 (1001h) | FREE |
| | FREE |
| | FREE |

1002 brackets sectors 1–8.

FIG. 10B

| | | |
|---|---|---|
| SECTOR 1 (1003a) | UNCOMMIT | ⎫ |
| SECTOR 2 (1003b) | COMMIT | |
| SECTOR 3 (1003c) | UNCOMMIT | |
| SECTOR 4 (1003d) | UNCOMMIT | ⎬ 1004 |
| SECTOR 5 (1003e) | UNCOMMIT | |
| SECTOR 6 (1003f) | UNCOMMIT | |
| SECTOR 7 (1003g) | UNCOMMIT | |
| SECTOR 8 (1003h) | UNSTABLE | ⎭ |
| | FREE | |
| | FREE | |

FIG. 11

| | | | | | | 1102 | |
|---|---|---|---|---|---|---|---|
| PHYSICAL SECTOR #0 TO 3 | SECTOR 1(1101a) | SECTOR 2(1101b) | SECTOR 3(1101c) | SECTOR 4(1101d) | UNCOMMIT | UNCOMMIT | UNCOMMIT |
| PHYSICAL SECTOR #4 TO 7 | SECTOR 5(1101e) | SECTOR 6(1101f) | SECTOR 7(1101g) | SECTOR 8(1101h) | UNCOMMIT | UNCOMMIT | UNCOMMIT |
| PHYSICAL SECTOR #8 TO 11 | SECTOR 9(1101i) | SECTOR 10(1101j) | SECTOR 30(1101k) | SECTOR 31(1101l) | UNCOMMIT | COMMIT | UNCOMMIT |
| | SECTOR 32(1101m) | SECTOR 33(1101n) | SECTOR 34(1101o) | SECTOR 35(1101p) | UNCOMMIT | UNCOMMIT | UNCOMMIT |
| | SECTOR 36(1101q) | SECTOR 37(1101r) | SECTOR 38(1101s) | SECTOR 39(1101t) | UNCOMMIT | UNCOMMIT | UNCOMMIT |
| | SECTOR 40(1101u) | SECTOR 41(1101v) | SECTOR 42(1101w) | | UNCOMMIT | UNCOMMIT | COMMIT | FREE |
| | | | | | FREE | FREE | FREE |

...

APPARATUS AND METHOD FOR PROVIDING ATOMICITY WITH RESPECT TO REQUEST OF WRITE OPERATION FOR SUCCESSIVE SECTOR

CROSS REFERENCE TO RELATED APPLICATION

This application claims priority from Korean Patent Application No. 10-2006-88723 filed on Sep. 13, 2006, in the Korean Intellectual Property Office, the disclosure of which is incorporated herein by reference in its entirety.

BACKGROUND OF THE INVENTION

1. Field of the Invention

Apparatuses and methods consistent with the present invention relate to an apparatus for providing atomicity with respect to a request of a write operation for successive sectors in a flash memory. More particularly, the present invention relates to an apparatus for providing atomicity with respect to a request of a write operation for successive sectors in a flash memory and a method of providing the same, in which a data write progress status of sectors is separately displayed during a write operation for one or more successive sectors in the flash memory, and even when power supply is interrupted during a data write operation, atomicity for the write operation for one or more successive sectors is ensured on the basis of the separately displayed data write progress status so as to minimize the lowering in the performance of a system.

2. Description of the Related Art

In recent years, a flash memory has been widely used in various applications, such as an embedded system, a mobile device, and the like, because it is nonvolatile like a hard disk, and has high access speed and low power consumption.

A flash memory based system includes a RAM that is a volatile memory, a controller in which a CPU is built, and a flash memory that is a non-volatile memory. In this flash memory based system, since abrupt power interrupt may occur often due to characteristics of the application fields, file systems used in this system need to be transactional.

However, according to a general method of using a flash memory, in a case where a write operation is performed in the flash memory, even if various actions that belong to one transaction are completed without an error or an error occurs in the various actions, it is not possible to ensure atomicity in which the error is processed without abnormality in the data. As a result, in order to provide a transaction function, a large amount of overhead is required in the file systems.

Meanwhile, when power is interrupted during a write operation for one or more successive sectors in the flash memory, a portion of data sectors that request a write operation may be programmed, and the other portion may not be programmed.

FIG. 1 is a diagram illustrating a structure of a flash memory device according to the related art.

A flash memory device 100 includes a plurality of blocks 110, and each of the blocks 110 becomes a unit of an erasing operation of the flash memory.

Further, each of the blocks 110 includes a plurality of pages 111, and each of the pages 111 becomes a unit of read and write operations in the flash memory.

An operating system performs a read/write request in a sector unit, and the page 111 of the flash memory is equal to a size of a sector or has a size that corresponds to any multiple of the size of the sector.

FIG. 2 is a diagram illustrating a write operation for one or more successive sectors executed in the flash memory shown in FIG. 1.

According to the related art, in order to indicate the fact that a program is normally completed, as shown in FIG. 2, a status bit 202 is allocated for each sector 201, and an initial value of the status bit 202 has a value of an invalid mark 0x1 (see reference numeral 202a).

When a program for a corresponding sector is completed without power interruption, a status bit has a value of a valid mark 0x0 (see reference numeral 202b).

FIG. 3 is a flowchart illustrating a process of a write operation for one or more successive sectors according to the related art.

After data is written in the sectors (Step S301), in order to indicate the fact that a program for the sectors is completed without power interrupt, a valid mark 0x0 indicating the fact that a corresponding sector is valid is programmed in a status bit of the sector (Step S302).

For reference, if an initial value of the status bit has a value of an invalid mark 0x1, a value of a valid mark, 0x0 is written.

After the process of Step S302, it is checked whether there remains a sector for data to be written (Step S303), and as a result of the check, if data is written in all of the sectors, the process is completed.

As the result of the check, if there remains a sector to be written, the process of Step S301 is repeated.

In the embodiment shown in FIG. 2 where data is written in six sectors including logical sectors 1 to 6, in Step S302, data is written in the logical sector 1 and a valid mark is displayed in a status bit corresponding to the logical sector 1. Then, data is written in the logical sector 2, and a valid mark is displayed in a status bit corresponding to the logical sector 2.

In the same manner, data is written in the logical sectors 3 to 6, and a valid mark is displayed in a status bit of each of the sectors.

FIG. 4 is a flowchart illustrating a process of inspecting validity of sectors in a write operation for one or more successive sectors according to the related art.

In the validity inspection of the sectors where the data is written, it is first determined whether a status bit of a sector is "1" (Step S401). At this time, if the status bit of the corresponding sector is not "1", it may be assumed that the corresponding sector is determined as a valid sector, and a sector program is completed (Step S402).

As a result of the process of Step S401, if the status bit of the sector is "1", it is assumed that the corresponding sector is determined as an invalid sector, and the sector program is not completed (Step S403).

As described above, the following problems exist in the related art. When power interrupt occurs during a write operation for one or more successive sectors, a portion of the sectors may be determined as valid sectors, and a portion of the sectors may be determined as invalid sectors. As a result, it is not possible to ensure atomicity for a write operation for one or more successive sectors.

SUMMARY OF THE INVENTION

An object of the invention is to provide an apparatus for providing atomicity with respect to a request of a write operation for successive sectors in a flash memory and a method of providing the same, which are capable of ensuring atomicity for a write operation for successive sectors and minimizing the lowering in the performance of a system, even when power interrupt occurs during the write operation for one or more successive sectors in the flash memory.

Objects of the invention are not limited to the above-mentioned objects, and other objects of the invention will be apparently understood by those skilled in the art through the following description.

According to an aspect of the present invention, there is provided an apparatus for providing atomicity with respect to a request of a write operation for successive sectors in a flash memory, the apparatus including: a data write module writing data in a main sector of a page and allocating status bits indicating a status of the data write to a spare sector of the page, a write progress managing module overwriting a commit mark in the spare sector allocated with the status bits, according to a progress status of the data write, and a validity determining module determining validity of the sectors on the basis of the overwritten commit mark and providing information of the successive sectors.

According to another aspect of the present invention, there is provided a method of providing atomicity with respect to a request of a write operation for successive sectors in a flash memory, the method including: writing data in a main sector of a page and allocating status bits indicating a status of the data write to a spare sector of the page, overwriting a commit mark in the spare sector allocated with the status bits, according to a progress status of the data write, and determining validity of the sectors on the basis of the overwritten commit mark and providing information of the successive sectors.

BRIEF DESCRIPTION OF THE DRAWINGS

The above and other features and advantages of the invention will become more apparent by describing in detail preferred embodiments thereof with reference to the attached drawings in which:

FIG. 2 is a diagram illustrating a conventional embodiment of a write operation for one or more successive sectors executed in a flash memory shown in FIG. 1;

FIGS. 10A to 10B are diagrams illustrating a write operation for one or more successive sectors in a small-block flash memory according to an exemplary embodiment of the invention;

FIG. 11 is a diagram illustrating a case in which power interrupt occurs during a write operation for one or more successive sectors in a large block according to an exemplary embodiment of the invention.

DESCRIPTION OF THE EXEMPLARY EMBODIMENTS

Figure 1:
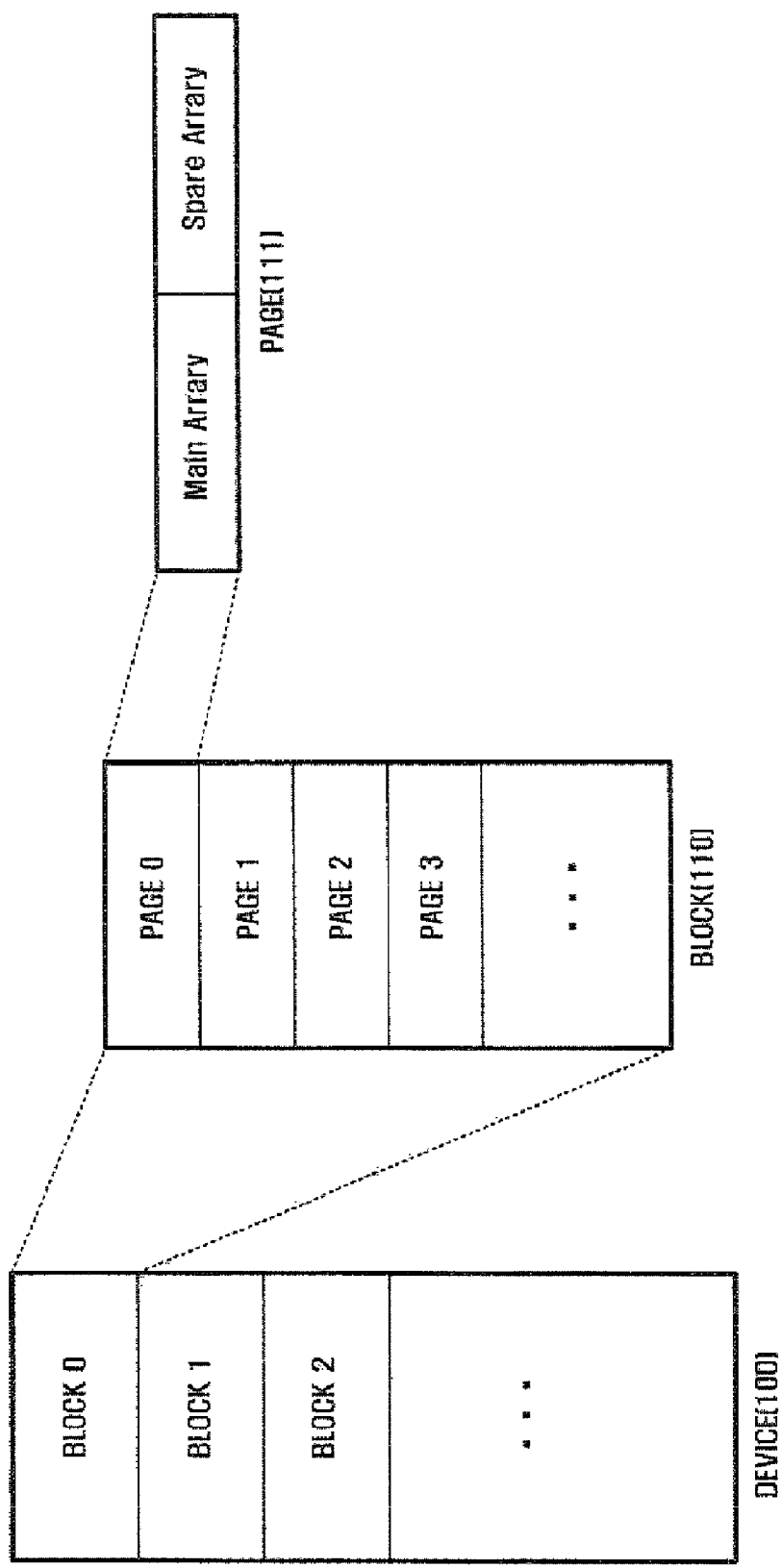
FIG. 1 is a diagram illustrating a structure of a flash memory device according to the related art.
Figure 3:
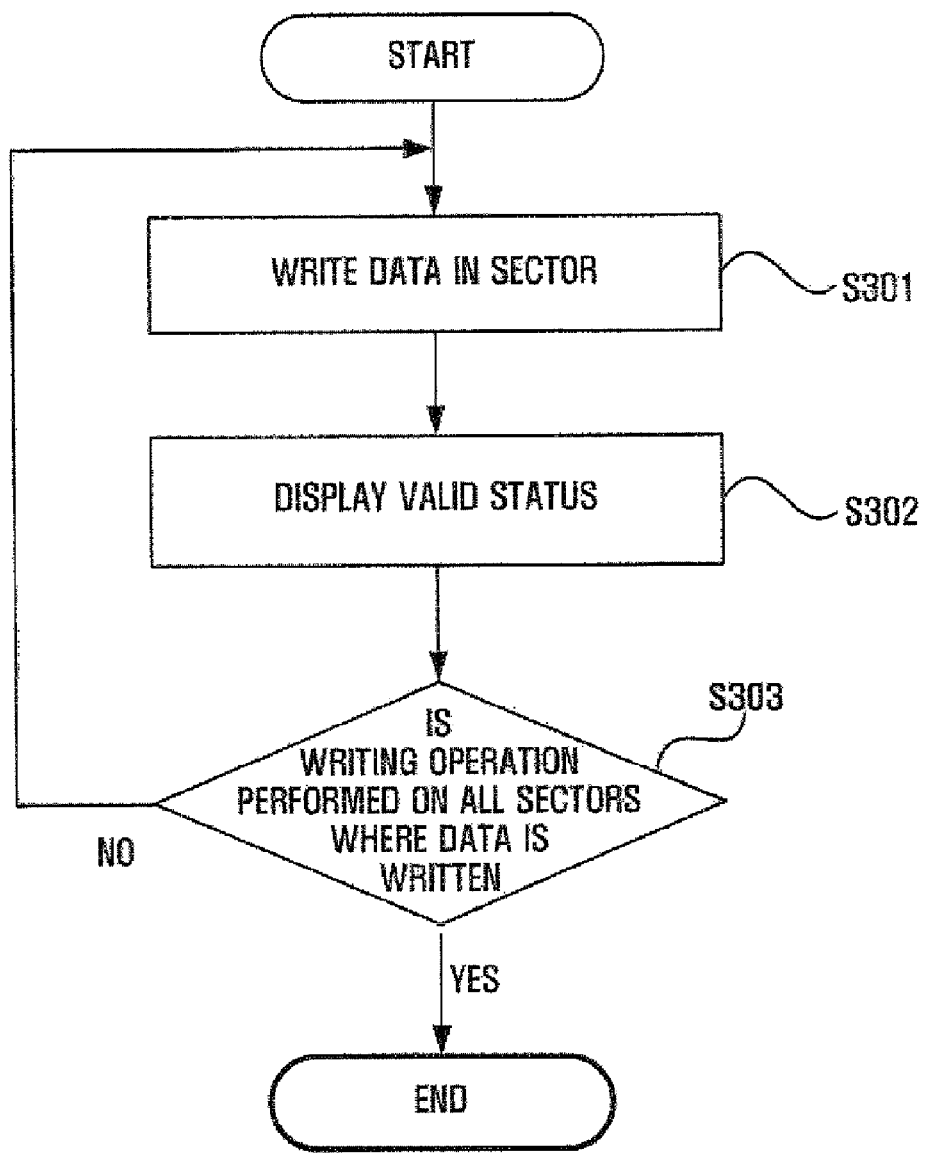
FIG. 3 is a flowchart illustrating a process of a write operation for one or more sectors according to the related art.
Figure 4:
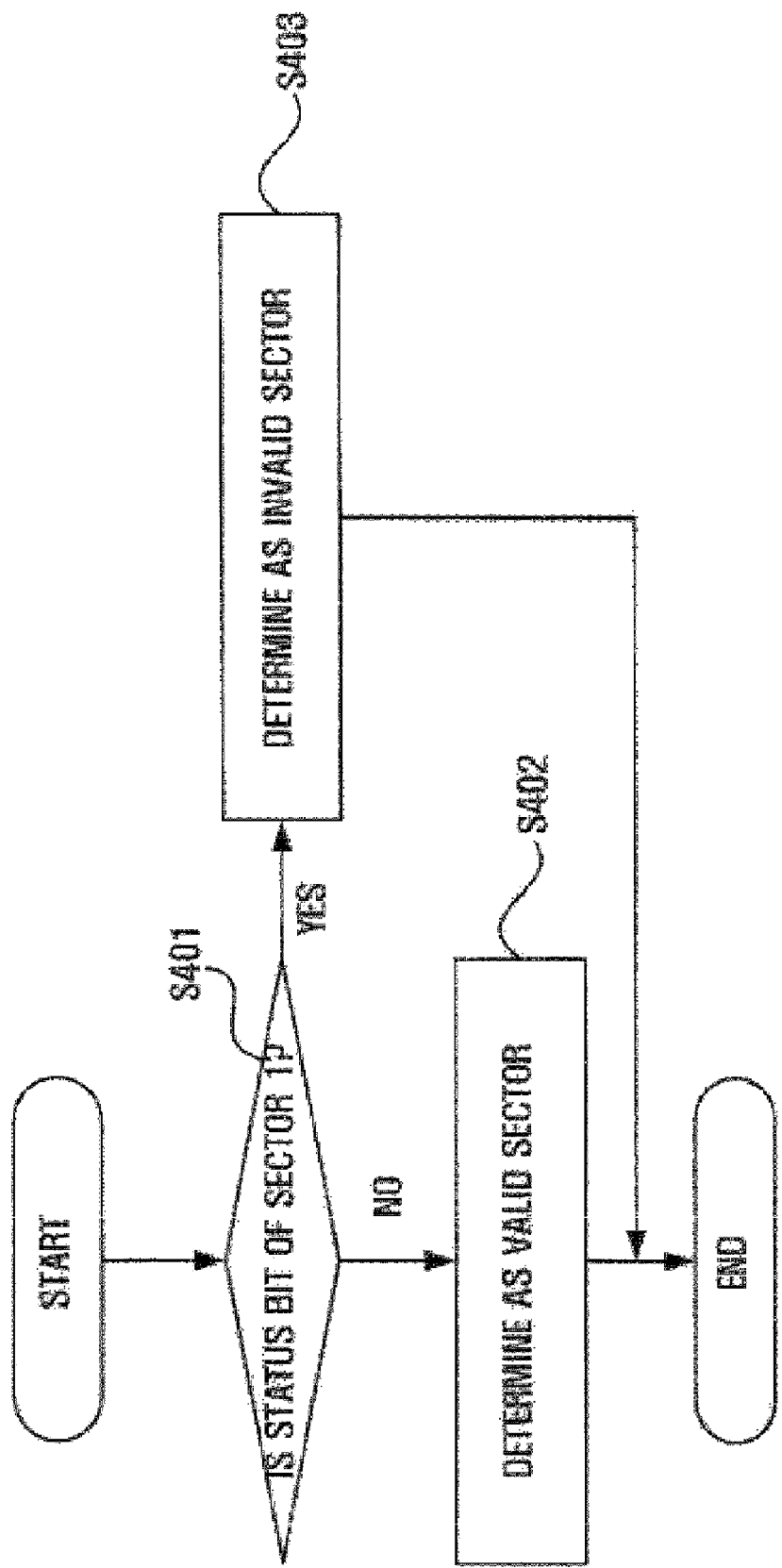
FIG. 4 is a flowchart illustrating a process of inspecting validity of a sector in a write operation for one or more successive sectors according to the related art.

Advantages and features of the invention and methods of accomplishing the same may be understood more readily by reference to the following detailed description of exemplary embodiments and the accompanying drawings.

The invention may, however, be embodied in many different forms and should not be construed as being limited to the embodiments set forth herein. Rather, these exemplary embodiments are provided so that this disclosure will be thorough and commit and will fully convey the concept of the invention to those skilled in the art, and the invention will only be defined by the appended claims. Like reference numerals refer to like elements throughout the specification.

The present invention will be described hereinafter with reference to block diagrams or flowchart illustrations of a method and an apparatus for providing atomicity with respect to a request of a write operation for successive sectors in a flash memory according to an exemplary embodiment thereof.

It will be understood that each block of the flowchart illustrations, and combinations of blocks in the flowchart illustrations can be implemented by computer program instructions.

These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks.

These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks.

The computer program instructions may also be loaded onto a computer or other programmable data processing apparatus to cause a series of operations to be performed on the computer or other programmable apparatus to produce a computer implemented process such that the instructions that are executed on the computer or other programmable apparatus provide for implementing the functions specified in the flowchart block or blocks.

Further, each block of the block diagrams may represent a module, segment, or portion of code, which comprises one or more executable instructions for implementing the specified logical function(s).

It should also be noted that in some alternative implementations, the functions noted in the blocks may occur out of order.

For example, two blocks shown in succession may in fact be executed substantially concurrently or the blocks may sometimes be executed in reverse order depending upon the functionality involved.

The present invention will now be described more fully with reference to the accompanying drawings, in which preferred embodiments of the invention are shown.

Figure 5:
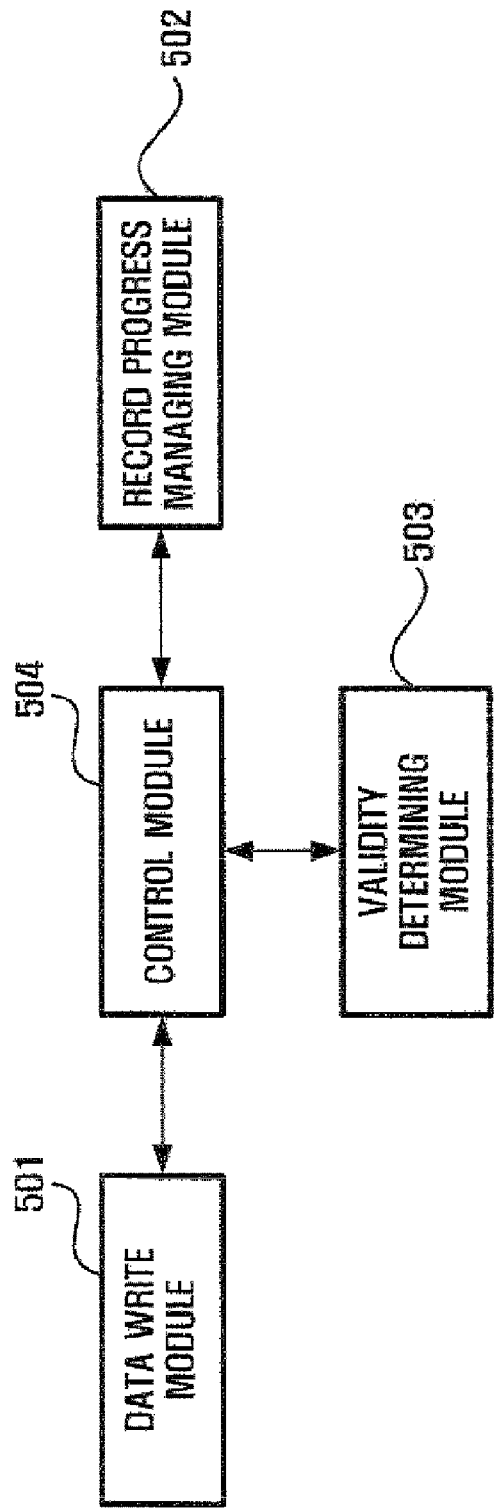
FIG. 5 is a block diagram illustrating a structure of an apparatus for providing atomicity with respect to a request of a write operation for successive sectors in a flash memory according to an exemplary embodiment of the invention.

FIG. 5 is a diagram illustrating a structure of an apparatus for providing atomicity with respect to a request of a write operation for successive sectors in a flash memory according to an embodiment of the invention.

An apparatus for providing atomicity with respect to a request of a write operation for successive sectors in a flash memory according to an exemplary embodiment of the invention includes a data write module 501 that writes data in a main sector of a page and allocates a status bit indicating a data write status to a spare sector of the page, a write progress managing module 502 that overwrites commit mark in the spare sector to which the status bit is allocated according to a progress status of the data write operation, a validity determining module 503 that determines validity of the corresponding sector on the basis of the overwritten commit mark and provides information of successive sectors, and a control module 504 that controls various modules.

Meanwhile, the term "module" used in the embodiment of the invention means software, or a hardware component such as an FPGA (Field Programmable Gate Array) or an ASIC (Application Specific Integrated Circuit) and the modules each perform allocated functions.

However, the modules are not limited to software or hardware.

The modules may be configured in an addressable storage medium, or may be configured to run on at least one processor.

Therefore, as an example, the modules include: components such as software components, object-oriented software components, class components, and task components; processors, functions, attributes, procedures, sub-routines, segments of program codes, drivers, firmware, microcodes, circuits, data, databases, data structures, tables, arrays, and variables.

The functions provided by the components and the modules may be combined into fewer components and modules or may be separated into additional components and modules.

The data write module 501 sequentially writes data in a main sector available in a block, and at the same time, allocates a bit indicating a progressing status of a data write operation, that is, a status bit to a spare sector in the block.

Figure 6:
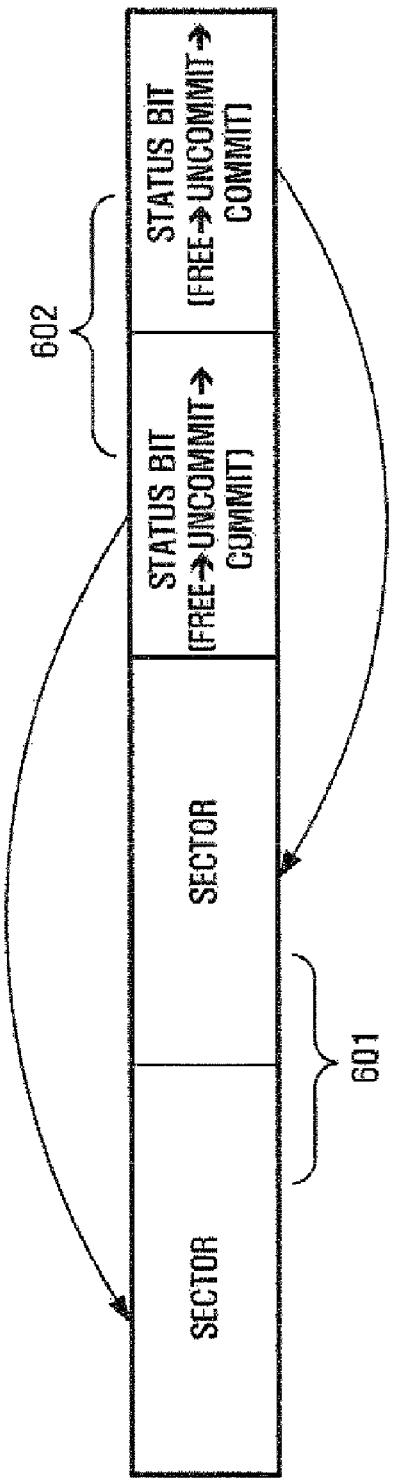
FIG. 6 is a diagram illustrating a format of a status bit allocated for each sector in an apparatus according to an exemplary embodiment of the invention.

FIG. 6 is a diagram illustrating a format of a status bit allocated for each sector in the data write module 501 that is a device according to an exemplary embodiment of the invention.

A status bit allocated for each main sector 601 in the data write module 501 may have a commit value 0x00000000, an uncommit value 0x1110000, or a free value 0x11111111, and each of the status bits is used to indicate whether each main sector 601 is valid.

Further, a status of a status bit is changed in order of a free status, an uncommit status, and a commit status.

For reference, in a NAND flash memory, when a bit status is changed from "1" to "0", the bit status cannot be changed again to "1" until the written data is erased. The status bit values "0x00000000 (commit)", "0x11110000 (uncommit)", and "0x11111111 (free)" that are used in this invention are exemplary, and the invention is not limited thereto.

The write progress managing module 502 overwrites a commit mark in the spare sector 602 to which the status bit is allocated according to a progress status of a data write operation.

According to a write operation for one or more successive sectors of this invention, the data write module 501 writes both data and a status bit by a write operation.

However, when a write operation is completed, the data write module 501 does not display a commit mark, and the write progress managing module 502 checks a data write progress status, and only allocates a commit mark to a sector where data is finally written.

Figure 7:
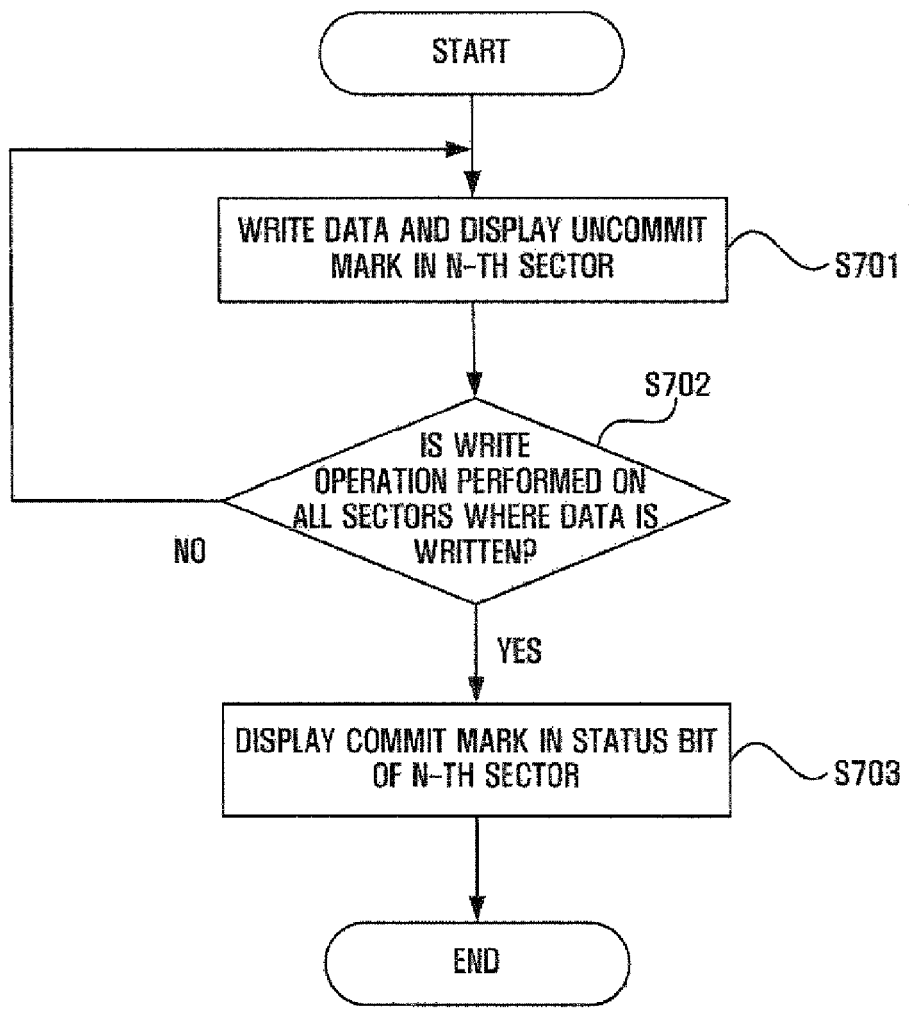
FIG. 7 is a flowchart illustrating a process of a write operation for one or more successive sectors according to an exemplary embodiment of the invention.

FIG. 7 is a flowchart illustrating a process of a write operation for one or more successive sectors according to an exemplary embodiment of the invention.

The data write module 501 writes data in a specific sector and displays an uncommit mark so as to indicate the fact that the data write is not completed (S701).

After the process of S701, the write progress managing module 502 determines whether the data write module 501 writes all of the data and the status bit to be written in a corresponding sector (S702). In this case, as a result of the determination, if the data write module 501 writes all of the data and the status bit in the corresponding sector, the write progress managing module 502 overwrites a status bit of an N-th spare sector with a commit mark (S703).

As a result of the process of S702, if there remains a sector where data is written, the processes from S701 are repeated.

For reference, in the flash memory, an erase-before-write operation is performed because of physical characteristics. According to this operation, when the data write module 501 performs a write operation in a sector, data of a block to which the corresponding sector belongs is erased by an erase operation, and a write operation is performed in the corresponding sector.

Thus, a large amount of time may be required for the same I/O, as compared with a hard disk that can perform an overwrite operation in a sector.

Further, if an erase operation is performed in a block of the flash memory one hundred thousand of times, the erase operation cannot be performed any more in the block of the flash memory.

Accordingly, the erase operation shortens a life span of the flash memory.

Because of this characteristic, if a write operation is performed for a specific sector of the flash memory, an available block or a block, in which the number of times an erase operation that has been performed is small, is allocated in the flash memory, and a write operation is performed in the corresponding block.

Software that performs this function is referred to as a flash translation layer (hereinafter, simply referred to as FTL), which performs a function for mapping a sector number of a file system with a sector number of a flash memory.

An FTL algorithm should perform this erase operation as rarely as possible, and the erase operation should not be concentrated on one block.

Figure 8:
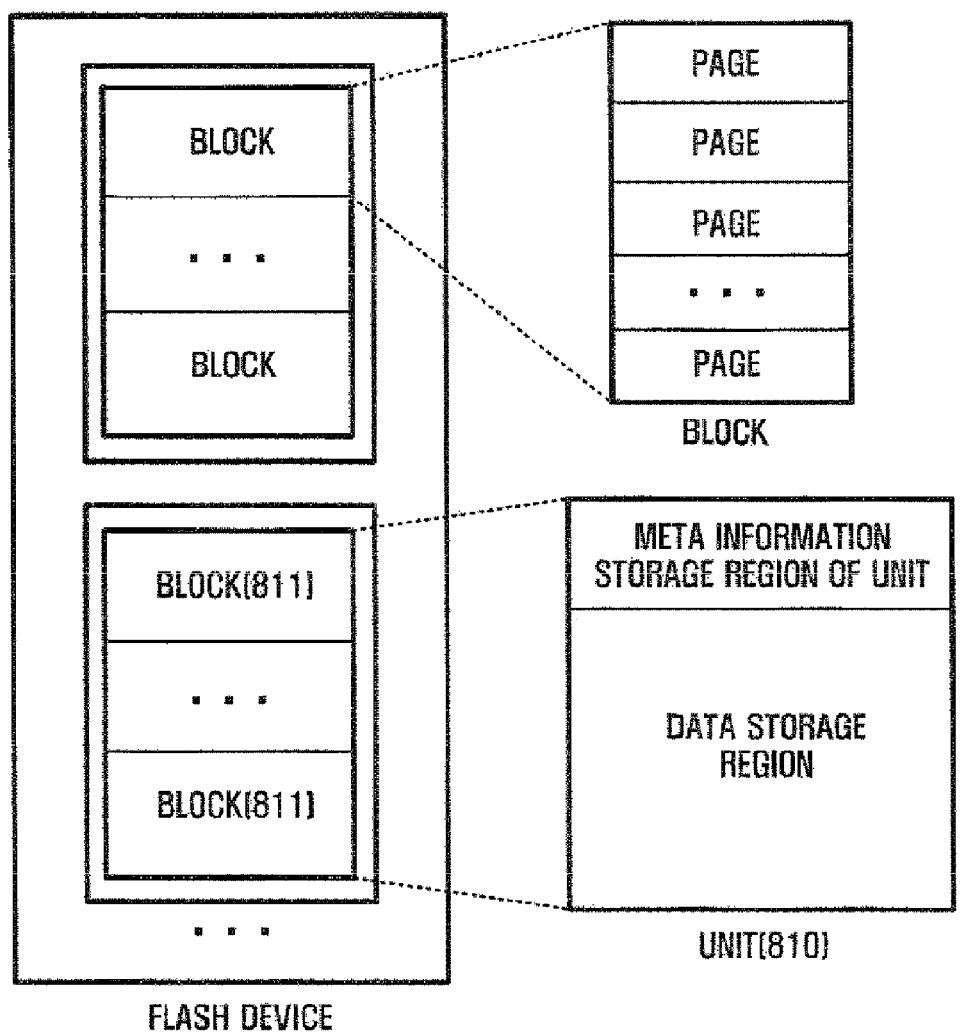
FIG. 8 is a diagram illustrating a relationship between a unit of a physical unit managed in a FTL (Flash Translation Layer) and a physical block of a flash device.

FIG. 8 is a diagram illustrating a relationship between a physical unit managed by the FTL and a physical block of a flash device.

A physical unit 810 includes a predetermined number of successive physical blocks 811. In the FTL, an erase unit is the physical unit 810, and a read/write unit is a sector unit.

Meanwhile, the validity determining module 503 determines the validity of sectors on the basis of a commit mark overwritten by the write progress managing module 502, and provides information of the successive sectors. A reference of the validity determination will be described in detail below.

Meanwhile, the flash memory may be divided into a small-block flash memory where one sector exists in one page and a large-block flash memory where two or more sectors exist in one page (in a current general flash memory, four sectors exist in one page).

In addition, a method of writing data in flash memory blocks according to a write algorithm of flash memory software may be divided into a method of sequentially writing data first in available sectors, and a method of writing data in a sector at an intermediate location of a flash memory.

A basic algorithm of this invention may be applied to the method of sequentially writing data first in available sectors.

In this invention, when a physical unit where data is written through a predetermined mapping process of a FTL according to a request of a successive logical write operation is determined, it is assumed that the fact that the number of free sectors capable of stratifying the logical write request always exists in the corresponding physical unit is ensured by the mapping process of the FTL.

Figure 9:
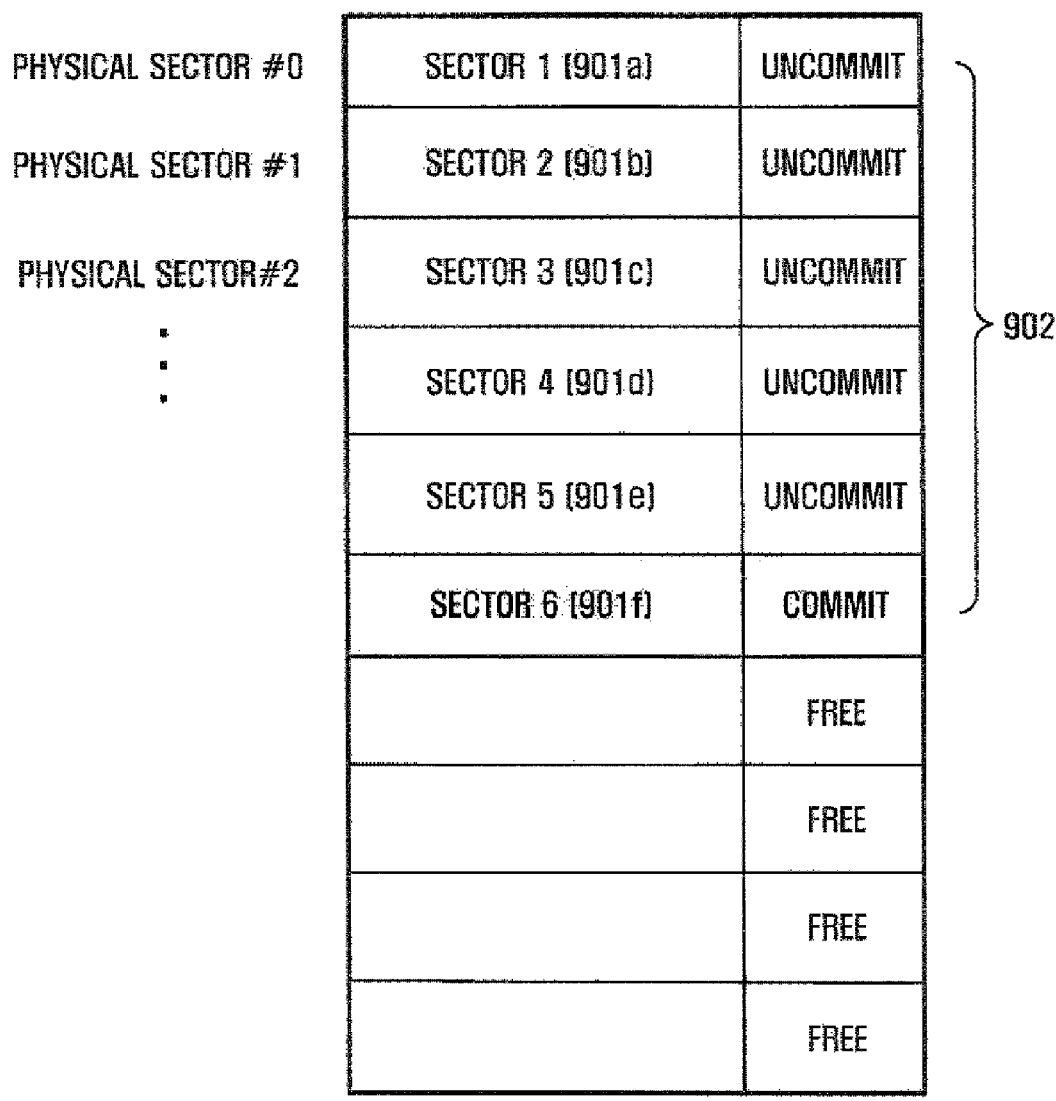
FIG. 9 is a diagram illustrating a write operation for one or more successive sectors in a small-block flash memory according to an exemplary embodiment of the invention.

FIG. 9 is a diagram illustrating a write operation for one or more successive sectors in a small-block flash memory according to an exemplary embodiment of the invention where one sector can be stored in one page.

It is assumed that a physical sector status of a physical unit becoming a subject of a logical sector write request is a free status from a sector 1.

A method of writing data in six sectors 901a to 901f including the sectors 1 to 6 is based on a flowchart shown in FIG. 7.

The data write module 501 writes data in the sectors 1 to 6, that is, the sectors 901a to 901f, and displays uncommit marks in status bits thereof If the data write is completed, the write progress managing module 502 performs a page write operation seven times on only the sector 6, that is, the sector 901f where a data write operation is finally performed, according to a method of overwriting a commit mark in a status bit 902.

The status bit 902 of the logical sector 6, that is, the logical sector 901f passes through a process of a free (0x11111111) status, an uncommit (0x11110000) status, and a commit (0x00000000) status.

A validity determination reference of the validity determining module 503 will now be described in detail below with reference to FIGS. 10 to 11.

The validity determination for sectors where data has been written is performed for each physical unit.

First, according to a sector mapping method of an FTL, the validity determining module 503 searches a physical unit including sectors where data has been written and checks validity on each of the sectors from a physical sector 0 to a final sector in the corresponding physical unit.

In this case, according to the reference of the validity check, when a status of a specific sector is "free", all sectors between a sector right subsequent to a sector where a commit mark is most recently displayed and a current sector may be determined as invalid sectors.

When the status bit of the specific sector indicates "uncommit", "valid" sectors or "invalid" sectors are determined according to status bits of sectors subsequent to the corresponding sector.

When the status bit of the specific sector indicates "commit", all sectors between a sector right subsequent to a sector where a commit mark is most recently displayed and a current commit sector may be determined as valid sectors.

When the status bit of the current sector is neither "commit" nor "uncommit", all sectors between a sector right subsequent to a sector where a "commit" mark is most recently displayed and a current sector may be assumed as "invalid" sectors.

In a small-block flash memory shown in FIG. 9, a "commit" mark is not displayed in the logical sectors 1 to 5, that is, the logical sectors 901a to 901e, but a "commit" mark is displayed in the logical sector 6, that is, the logical sector 901f.

Accordingly, all of the logical sectors 1 to 6, that is, the logical sectors 901a to 901f may be determined as valid sectors.

That is, the data write module 501 sequentially writes data from available main sectors, and the write progress managing module 502 displays a commit mark when data write is completed. Accordingly, even when an uncommit mark is displayed in a current sector, a current sector may be assumed as a valid sector if a sector where a "commit" mark is displayed exists in the next pages. The sector where the "commit" mark is displayed is also a valid sector.

In this case, however, sectors between a current sector and a sector where a commit mark is displayed until the sector where the commit mark is displayed is discovered need to be sectors where an uncommit mark is displayed.

FIGS. 10A and 10B are diagrams illustrating a case where power interrupt occurs during a write operation for one or more successive sectors in a small-block flash memory.

It is assumed that a write operation for logical sectors 1 and 2 and a write operation for logical sectors 3 to 8 are requested through two successive sector write operations.

FIG. 10A shows a state where data is completely written in first and second logical sectors 1001a and 1001b by a first write operation for successive sectors, and a power interrupt occurs right after the data write module 501 writes data in the seventh sector 1001g and displays an uncommit mark during a write operation for successive sectors is performing on the third to seventh sectors 1001c to 1001g.

In this case, the validity determination by the validity determining module 503 starts from a first physical sector of a physical unit that has corresponding data.

The status bit 1002 is in an "uncommit" status in the first sector 1001a, while the status bit 1002 is in a "commit" status in a second sector 1001b. Therefore, the first and second sectors 1001a and 1001b are determined as valid sectors.

Since all of the status bits 1002 of the third to seventh sectors 1001c to 1101g are in an "uncommit" status, determination whether the corresponding sectors are "valid" or "invalid" is reserved.

The validity determining module 503 checks the status bits 1002 of sectors until the seventh sector 1001g, and then checks the status bit 1002 of the eighth sector 1001h.

As a result of the check, if the status bit 1002 of the eighth sector 1001h is "free", all of the third to seventh sectors 1001c to 1001g are determined as "invalid" sectors.

FIG. 10B shows a state where power interrupt occurs while the data write module 501 writes data in the eighth sector 1003h in a second write operation for successive sectors and displays its status bit 1004 with an "uncommit" mark.

The eighth sector 1003h is a final sector among sectors where a write operation for successive sectors is requested. Accordingly, if a write operation progresses in a normal state, the data is written in the eighth sector 1003h by the data write module 501, its status bit 1004 is displayed by "uncommit" mark, and a "commit" mark is overwritten in the status bit 1004 by the write managing progress module 502.

However, since the status bit 1004 may be different according to a time point of when power supply is interrupted, a bit status of the eighth sector 1003h is displayed as an unstable status.

In this case, an "unstable" status means that the status bit does not belong to either an "uncommit" status or a "commit" status due to abrupt power interruption.

At this time, since power supply is interrupted while displaying an "uncommit" mark 0x11110000, the status bit 1004 cannot be displayed by a commit mark 0x00000000.

The validity determination by the validity determining module 503 is the same as that having been described with reference to FIG. 10A.

When the eighth sector 1003h is verified by the validity determining module 503, the status bit 1004 of the eighth sector 1003h does not indicate "a commit" status, and thus the third to eighth sectors 1003c to 1003h are determined as "invalid" sectors.

FIG. 11 is a diagram illustrating a write operation for one or more successive sectors in a large-block flash memory according to an exemplary embodiment of the invention where four sectors can be stored in one page.

A write operation is performed for successive sectors until the first to tenth logical sectors 1101a to 1101j, and a write operation is performed for successive sectors until thirtieth to forty second sectors 1110k to 1101w.

Accordingly, the data write module 501 writes data in the logical sectors until the first to tenth logical sectors 1101a to 1101j, and displays an "uncommit" mark.

In addition, the write progress managing module 502 overwrites a "commit" mark in a status bit of the final logical sector, that is, a final logical sector 1101j.

Then, the data write module 501 writes data in the logical sectors until the thirtieth to forty second logical sectors 1101k to 1101w, and displays an "uncommit" mark.

In addition, the write progress managing module 502 overwrites a "commit" mark in a status bit 1102 of the final logical sector, that is, the forty second logical sector 1101w.

As such, the validity determination by the validity determining module 502 for the sectors where data has been written by requesting a write operation for successive sectors twice, that is, the first to tenth sectors 1101a to 1101j and the thirtieth to forty second 1101k to 1101w is determined by the same method as the case in a small block that has been described with reference to FIGS. 9 to 10B.

Figure 12:
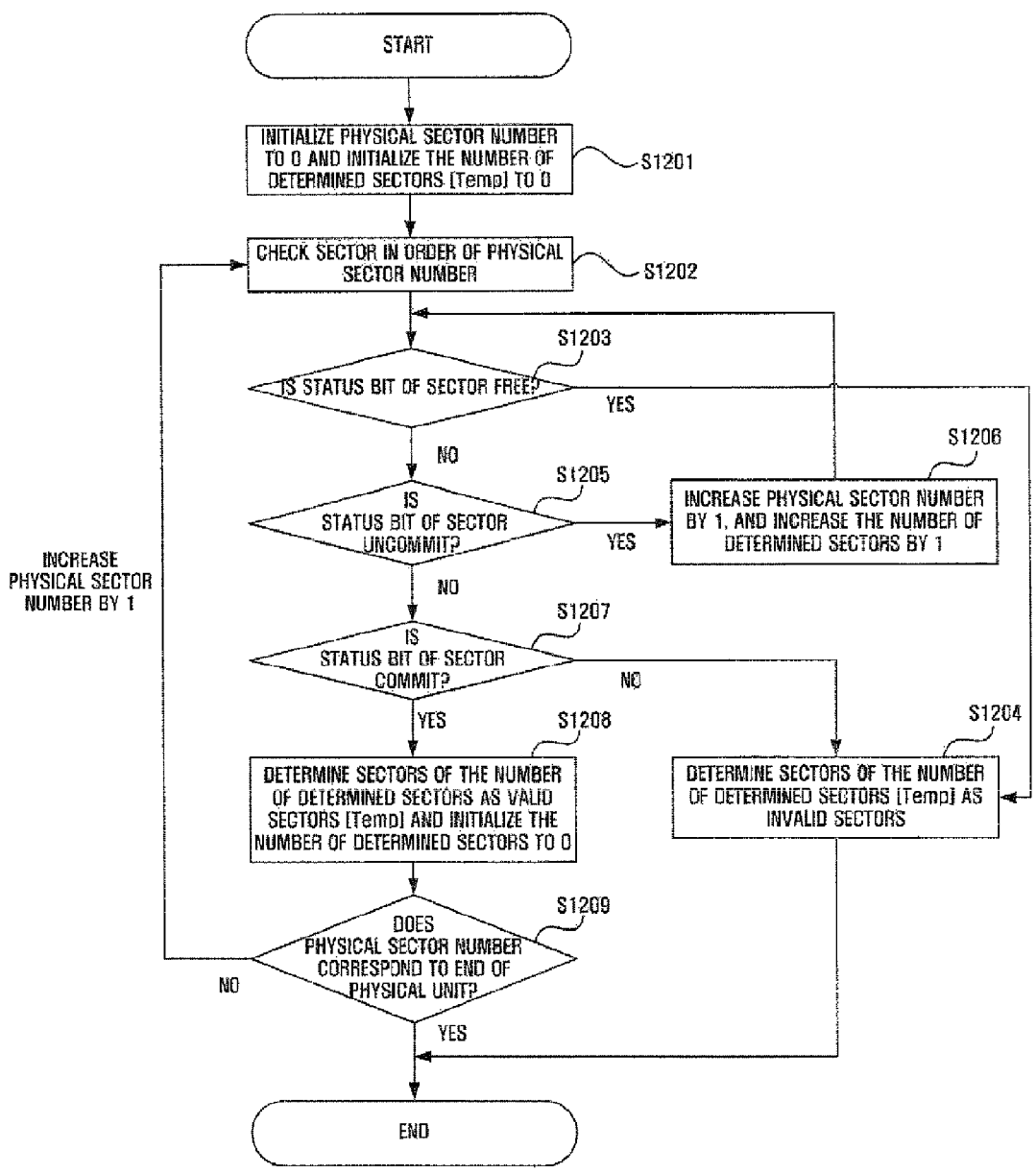
FIG. 12 is a diagram illustrating a write operation for one or more successive sectors in a large-block flash memory according to an exemplary embodiment of the invention.

FIG. 12 is a flowchart illustrating a method of inspecting the validation of sectors in an apparatus according to an exemplary embodiment of the invention.

The validity determining module 503 initializes the number of sectors whose validity is determined (hereinafter, referred to as Temp) and a physical sector number to "0" (S1201).

After the process of S1201, sectors are checked in order of physical sector numbers (S1202).

After the process of S1202, it is checked whether the status bit of the sector is free (S1203).

As a result of the process of S1203, if the status bit of the sector is "free", the checked sectors are determined as invalid sectors (S1204).

As a result of the process of S1203, if the status bit of the sector is not "free", it is checked whether the status bit of the sector is "uncommit" (S1205).

As a result of the process of S1205, if the status bit of the sector is "uncommit", it is determined according to a status bit of a next sector whether the currently checked sectors are valid or invalid. Therefore, a physical sector number to be checked and the number of sectors whose validity are determined is increased by 1 (S1206), and the process of S1203 is repeated.

As a result of the process of S1205, if the status bit of the sector is not "uncommit", it is checked whether the status bit of the sector is "commit" (S1207).

As a result of the process of S1207, if the status bit of the sector is "commit", the checked sectors until now are determined as valid sectors, and the number of the currently checked sectors is initialized to 0 (S1208).

As a result of the process of S1207, if the status bit of the sector is not "commit", the currently checked sectors are determined as invalid sectors.

After the process of S1208, it is checked whether a physical sector number of the finally checked sector corresponds to an end of the physical unit (S1209). In this case, if the physical sector number of the finally checked sector corresponds to the end of the physical unit, a validity inspection of the sectors is completed, and if the physical sector number of the finally checked sector does not correspond to the end of the physical unit, the process of S1202 is repeated while increasing a physical sector number.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

According to an apparatus for providing atomicity with respect to a request of a write operation for successive sectors in a flash memory according to an exemplary embodiment of the invention and a method of providing the same, the following effect can be achieved.

Even when power supply is interrupted during a write operation for one or more successive sectors in a flash memory, atomicity can be ensured in which all of the data sectors where a write operation is requested are read or not read, which minimizes the lowering in the performance of a system.

What is claimed is:

1. An apparatus for providing atomicity with respect to a request of a write operation for sectors in a flash memory, the apparatus comprising:
   a data write module which writes data under a control of a processor, in a main sector of a page, allocates status bits indicating a status of the data write to a spare sector of the page, and writes an uncommit status to the status bits;
   a write progress managing module which overwrites a commit mark in the spare sector allocated with the status bits, according to a progress status of the data write; and
   a validity determining module which determines validity of successive sectors on a basis of the overwritten commit mark and which provides information regarding the successive sectors;
   wherein, if a status bit of a specific sector is free, the validity determining module determines, as invalid sectors, sectors between a sector in which a commit mark is most recently displayed and the specific sector.

2. The apparatus of claim 1, wherein the data writing module sequentially writes the data and the status bits in available sectors.

3. The apparatus of claim 1, wherein the validity determining module determines validity of the sectors in a physical unit.

4. The apparatus of claim 1, wherein the validity determining module determines validity of a specific sector according to status bits of sectors subsequent to the specific sector, based on a status bit of the specific sector being uncommit.

5. The apparatus of claim 4, wherein, if the status bit of the sector subsequent to the specific sector is commit, the validity determining module determines that sectors between the specific sector and the previous sector in which the status bit is commit are valid.

6. The apparatus of claim 4, wherein, if the status bit of the sector subsequent to the specific sector is neither commit or uncommit, the validity determining module determines, as invalid sectors, sectors between a sector in which a commit mark is most recently displayed and a current sector.

7. The apparatus of claim 1, wherein the main sector and the spare sector are of a single physical sector.

8. The apparatus of claim 1, wherein the successive sectors follow the main sector so that an order of data writing in the page is from the main sector to the successive sectors.

9. A method of providing atomicity with respect to a request of a write operation for sectors in a flash memory, the method comprising:
  writing data by a processor, in a main sector of a page, allocating status bits indicating a status of the data write to a spare sector of the page, and writing an uncommit status to the status bits;
  overwriting a commit mark in the spare sector allocated with the status bits, according to a progress status of the data write; and
  determining validity of successive sectors on a basis of the overwritten commit mark and providing information regarding the successive sectors;
  wherein, in the determining of the validity of the sectors on the basis of the overwritten commit mark and the providing of information of the successive sectors, if a status bit of a specific sector is free, sectors between a sector in which a commit mark is most recently displayed and the specific sector are determined as invalid sectors.

10. The method of claim 9, wherein, in the writing of data in the main sector of the page and the allocating of the status bits indicating the status of the data write to the spare sector of the page, the data and the status bits are sequentially written in available sectors.

11. The method of claim 9, wherein, in the determining of the validity of the sectors on the basis of the overwritten commit mark and the providing of information of the successive sectors, validity of the sectors is determined in a physical unit.

12. The method of claim 9, wherein, in the determining of validity of the sectors on the basis of the overwritten commit mark and the providing of information of the successive sectors, if a status bit of a specific sector is uncommit, validity of the specific sector is determined according to status bits of sectors subsequent to the specific sector.

13. The method of claim 12, wherein, in the determining of validity of the sectors on the basis of the overwritten commit mark and the providing of information of the successive sectors, if the status bit of the sector subsequent to the specific sector is commit, sectors between the previous sector in which a commit mark is displayed and the specific sector are determined as valid sectors.

14. The method of claim 12, wherein, in the determining of validity of the sectors on the basis of the overwritten commit mark and the providing of information of the successive sectors, if a status bit of the sector subsequent to the specific sector is neither commit or uncommit, sectors between a sector in which a commit mark is most recently displayed and a current sector are determined as invalid sectors.

15. The method of claim 9, wherein the main sector and the spare sector are of a single physical sector.

16. The method of claim 9, wherein the successive sectors follow the main sector so that an order of data writing in the page is from the main sector to the successive sectors.

* * * * *